US009780016B2

(12) United States Patent
Hagiwara et al.

(10) Patent No.: US 9,780,016 B2
(45) Date of Patent: Oct. 3, 2017

(54) LEAD FRAME, ELECTRONIC CONTROL DEVICE USING LEAD FRAME, AND LEAD-FRAME MOUNTING METHOD

(71) Applicant: HITACHI AUTOMOTIVE SYSTEMS, LTD., Hitachinaka-shi, Ibaraki (JP)

(72) Inventors: Katsumasa Hagiwara, Isesaki (JP); Haruaki Motoda, Isesaki (JP)

(73) Assignee: HITACHI AUTOMOTIVE SYSTEMS, LTD., Hitachinaka-Shi (JP)

( * ) Notice: Subject to any disclaimer, the term of this patent is extended or adjusted under 35 U.S.C. 154(b) by 0 days.

(21) Appl. No.: 14/913,010

(22) PCT Filed: Feb. 3, 2014

(86) PCT No.: PCT/JP2014/052398
§ 371 (c)(1),
(2) Date: Feb. 19, 2016

(87) PCT Pub. No.: WO2015/040868
PCT Pub. Date: Mar. 26, 2015

(65) Prior Publication Data
US 2016/0211199 A1    Jul. 21, 2016

(30) Foreign Application Priority Data
Sep. 19, 2013 (JP) .................................. 2013-193854

(51) Int. Cl.
*H01L 23/495* (2006.01)
*H01L 23/498* (2006.01)
*H01L 25/00* (2006.01)

(52) U.S. Cl.
CPC .. *H01L 23/49517* (2013.01); *H01L 23/49541* (2013.01); *H01L 23/49811* (2013.01); *H01L 25/00* (2013.01); *H01L 2924/0002* (2013.01)

(58) Field of Classification Search
CPC ......... H01L 23/49517; H01L 23/49541; H01L 25/00; H01L 23/49811; H01L 2924/0002
USPC ........................................................ 257/666
See application file for complete search history.

(56) References Cited

U.S. PATENT DOCUMENTS

2006/0006749 A1    1/2006  Sasaki et al.
2012/0300522 A1*  11/2012  Tokuyama ............ H01L 25/072
                                            363/131

FOREIGN PATENT DOCUMENTS

| JP | 01-146474 U | 10/1989 |
|----|-------------|---------|
| JP | 04-142098 A | 5/1992 |
| JP | 2000-294330 A | 10/2000 |
| JP | 2002-222909 A | 8/2002 |

(Continued)

*Primary Examiner* — Fernando L Toledo
*Assistant Examiner* — Adam S Bowen
(74) *Attorney, Agent, or Firm* — Foley & Lardner LLP

(57) ABSTRACT

Conventional lead frames could neither be self-supporting nor be picked up by an automatic mounter through suction and mounted on a circuit board. Lead frame 15 is equipped with a plurality of leads 15*d*, each lead having a land-connection section 15*c* formed on one end of a pin-shaped terminal 15*a* with a bent section therebetween 15*b*; and a joining section 15*e* joining the plurality of leads 15*d*. The joining section 15*e* is formed by joining a base plate to the ends of land-connection sections 15*c*. This base plate makes the leads 15*d* stand upright and/or has a suction surface 15*f* which may be picked up by an automatic lead frame mounting device via suction.

2 Claims, 11 Drawing Sheets

(56) References Cited

FOREIGN PATENT DOCUMENTS

| JP | 2004-134436 A | 4/2004 |
| JP | 2004-153004 A | 5/2004 |
| JP | 2006-021552 A | 1/2006 |
| JP | 2008-300628 A | 12/2008 |
| JP | 2011-036110 A | 2/2011 |
| JP | 2013-033598 A | 2/2013 |

* cited by examiner

FIG. 10
(a)
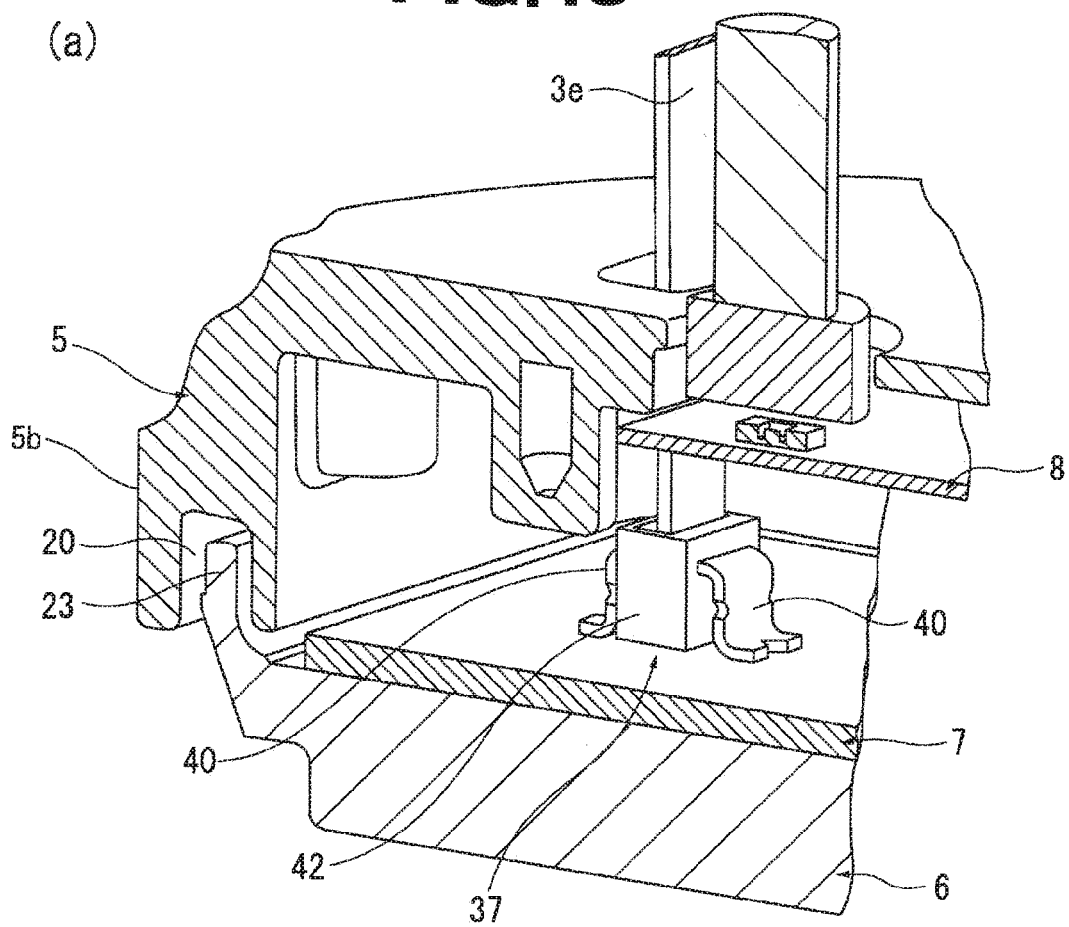
(b)
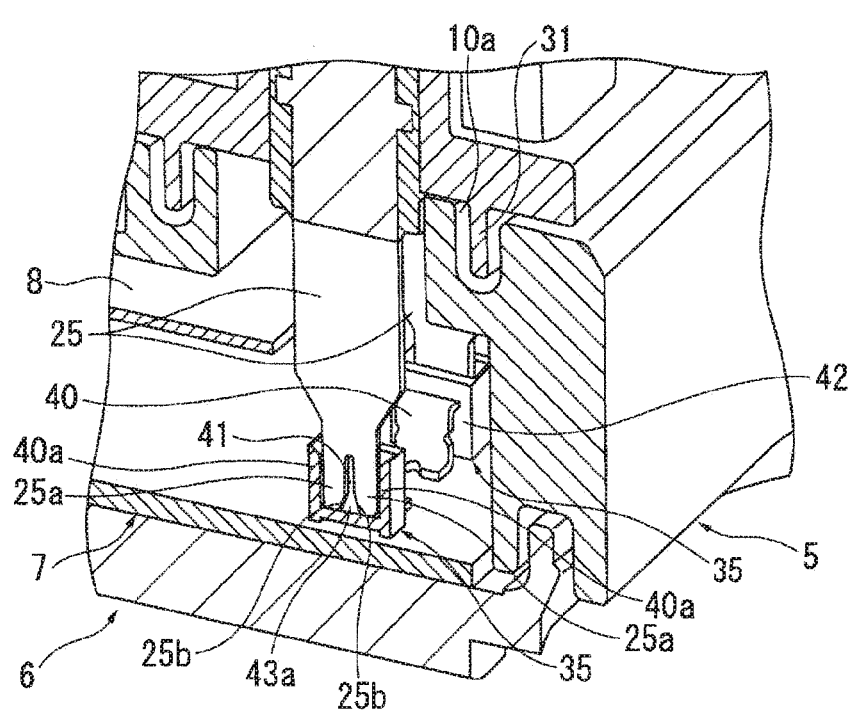

FIG. 11
(a)
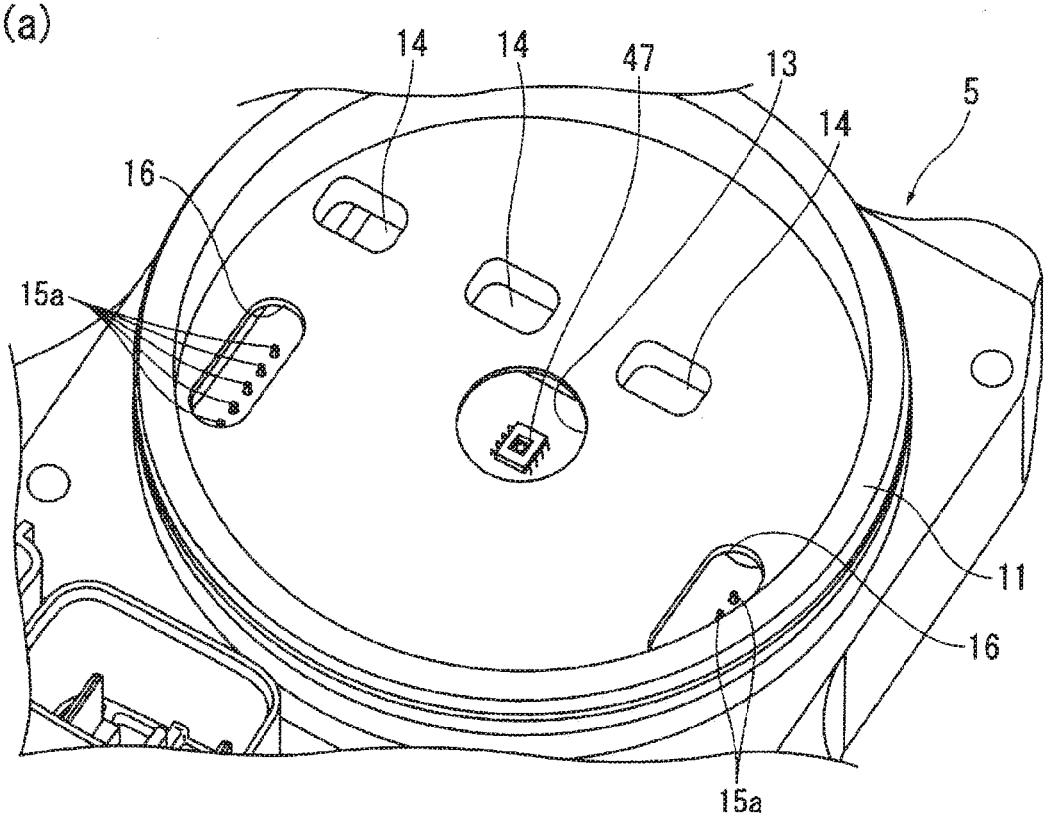
(b)
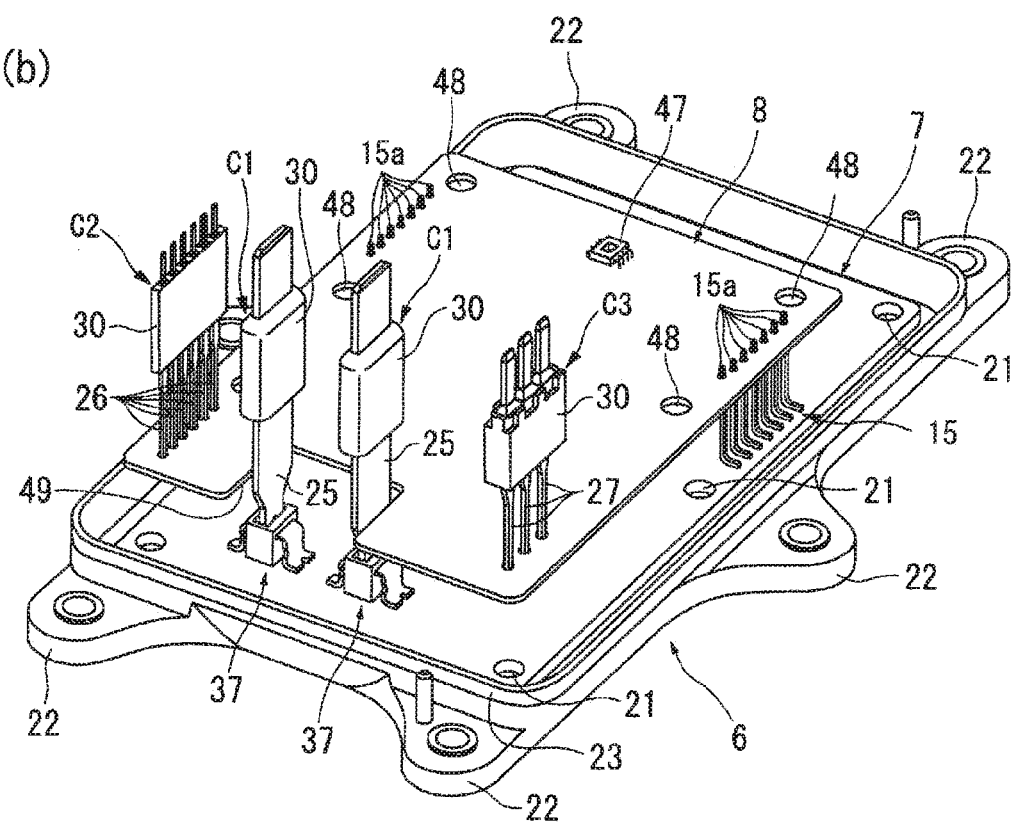

LEAD FRAME, ELECTRONIC CONTROL DEVICE USING LEAD FRAME, AND LEAD-FRAME MOUNTING METHOD

TECHNICAL FIELD

The present invention relates to a lead frame for use on a circuit board, an electronic control device using the lead frame, and a method of mounting the lead frame on a circuit board.

BACKGROUND OF THE INVENTION

For example, Patent Publication 1 is publicly known as disclosing a lead frame used for connecting one board with another board and a lead frame for connecting a power board or a control board, for example, in an electronic control device such as an engine control device (ECU).

PRIOR ART PUBLICATIONS

Patent Publications

Patent Publication 1: Japanese Patent Application Publication No. 2011-36110

SUMMARY OF THE INVENTION

Task to be Solved by the Invention

The lead frame of Patent Publication 1, however, has a structure in which a plurality of terminals extending in the up-and-down direction are longitudinally aligned and retained by a resin member. Therefore, it is necessary to align and position the plurality of terminals in a resin mold and mold the resin member. This has been a cause for high manufacturing costs.

Means for Solving the Task

The present invention provides a lead frame comprising a plurality of leads, each of the leads having a land-connection section formed on one end of a pin-shaped terminal with a bent section therebetween, and a joining section joining the plurality of leads,
wherein the joining section is formed by joining a base plate to the ends of the land-connection sections so that the plurality of leads stand upright.

Advantageous Effect of the Invention

The lead frame of the present invention comprises a base plate joined to the ends of land-connection sections so that the plurality of leads stand upright. Therefore, a joining section formed by a resin member as in Patent Publication 1 becomes unnecessary and the manufacturing costs can be reduced.

BRIEF DESCRIPTION OF DRAWINGS

FIG. 10 (*a*) is an enlarged view showing a terminal connection on the side of a three-phase motor, and FIG. 10 (*b*) is an enlarged sectional view showing a terminal connection on the side of a connector;
FIG. 11 (*a*) is a perspective view of a joint section of a case, and FIG. 11 (*b*) is an image view showing a condition of the case removed.

MODE FOR IMPLEMENTING THE INVENTION

Figure 1:
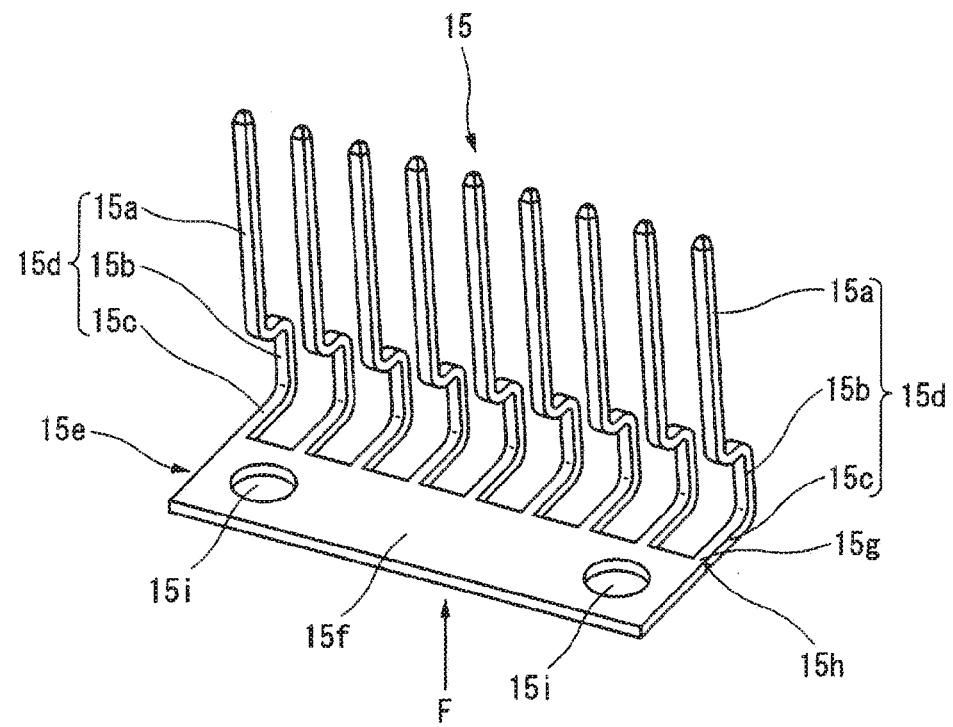
FIG. 1 is a perspective view of a lead frame.

In the following, the first embodiment of the present invention will be explained with reference to FIGS. 1 to 11. FIG. 1 is a perspective view of lead frame 15. Lead frame 15 includes a plurality of leads 15*d*, each of the leads having a land-connection section 15*c* formed on the lower end of a pin-shaped terminal 15*a* with bent section 15*b* therebetween, and a joining section 15*e* joining the plurality of leads 15*d* together.

Joining section 15*e* is formed in a rectangular plate-like shape. Joining section 15*e* is formed by retaining the plurality of leads 15*d* in an upright standing position and joining a base plate thereto. The base plate has suction surface 15*f* for pick up by a lead frame automatic mounting device via suction.

Lead frame 15 is formed by punching a conductive metal plate into a predetermined shape and bending it into a generally L-shape. Bent section 15*b* is formed by bending the lower end of terminal 15*a* into an inverse C-shape. The lower side of bent section 15*b* forms land-connection section 15*c*.

Thin section 15*g* is formed on an end of land-connection section 15*c* on the side of joining section 15*e* to facilitate cutting of land-connection section 15*c* at the end. Thin section 15*g* is formed by forming a V-shaped groove 15*h* on land-connection section 15*c*. Furthermore, 15*i* refers a positioning hole used when forming lead frame 15 such as by punching a metal plate.

By applying force F in a direction pushing joining section 15*e* upwardly in FIG. 1, joining section 15*e* is easily cut at thin sections 15*g* and separated from leads 15*d*. With this, leads 15*d* remain on the side of drive circuit board 7.

Figure 2:
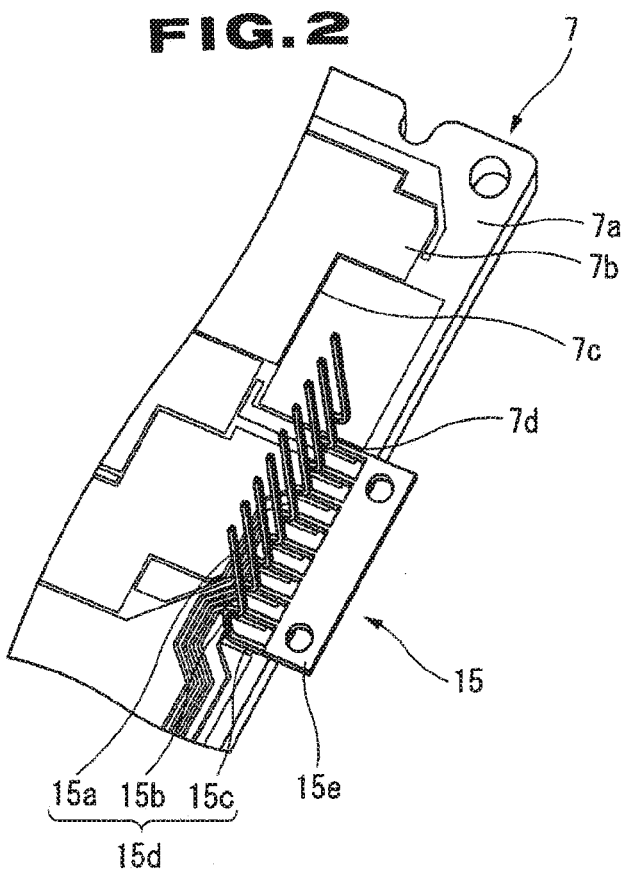
FIG. 2 is a perspective view showing the lead frame attached to a circuit board.

As shown in FIG. 2, drive circuit board 7 is formed by forming wiring patterns 7*c* and lands 7*d* on metal plate 7*a* as a base, with insulating layer 7*b* therebetween.

Figure 3:
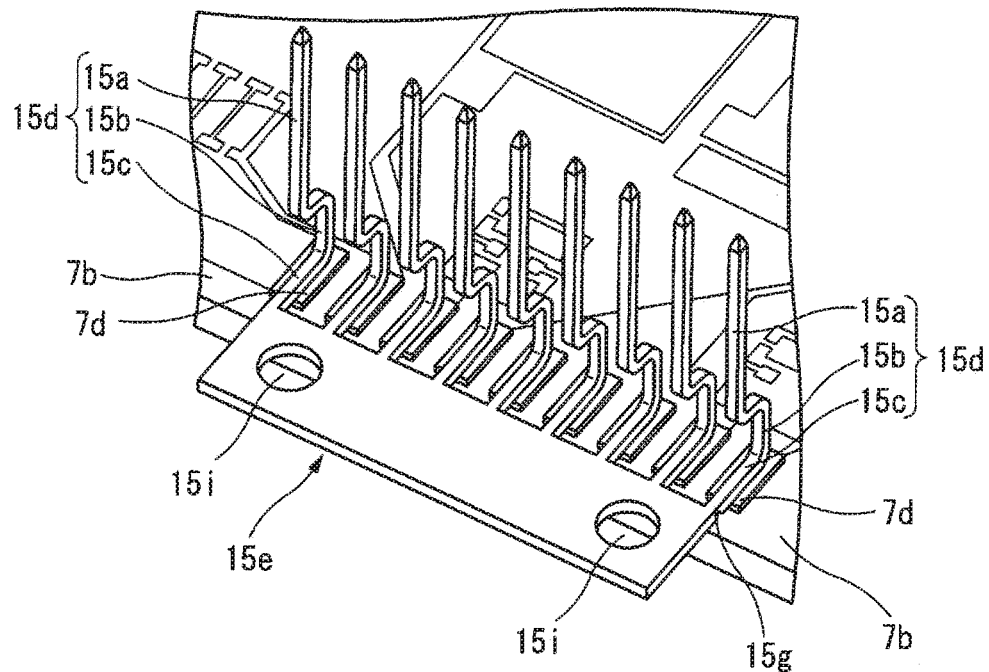
FIG. 3 is an enlarged perspective view of the lead frame section in FIG. 2.

As shown in FIG. 3, in a condition in which a portion of land-connection section 15*c*, specifically a portion including thin section 15*g*, protrudes above insulating layer 7*b* outside land 7*d* of drive circuit board 7, a portion of land-connection section 15*c* other than the protruding portion is connected and secured on land 7*d* with solder, etc.

Figure 4:
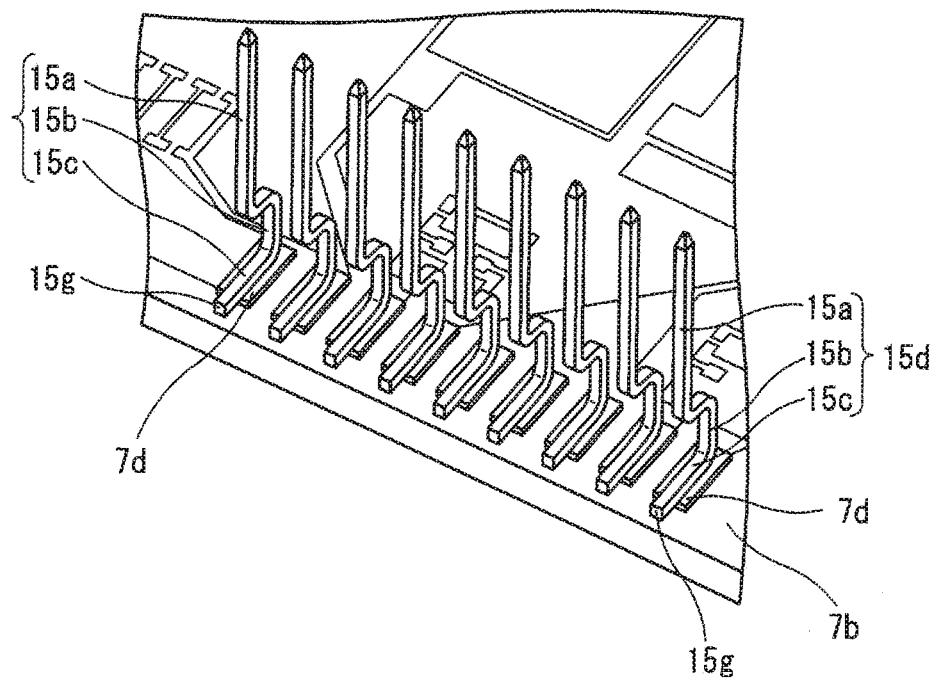
FIG. 4 is a perspective view with the joining section (base) removed.

Then, as shown in FIG. 4, land-connection sections 15c are cut at thin sections 15g, thereby separating and removing joining section 15e from leads 15d, and only leads 15d remain on the side of drive circuit board 7. In the above embodiment, thin section 15g is formed by providing a V-shaped groove 15h on the bottom face of land-connection section 15c. Groove 15h may be provided, however, on both top and bottom faces or on the top face. Furthermore, the shape of groove 15h is not limited to a V-shape and may be U-shaped or may have another shape or may be a slit.

By appropriately sizing joining section 15e of lead frame 15, (1) it becomes possible to retain lead frame 15 in an upright standing position using joining section 15e, thereby making handling of the lead frame easy, and/or (2) it becomes possible to use joining section 15e as a suction surface when the lead frame is mounted on a circuit board using a lead frame automatic mounting device.

One or both of the above two advantageous effects can be obtained.

The lead frame 15 of this embodiment can easily be formed by punching a sheet of metal plate into a predetermined shape and then bending it into a predetermined shape.

Next, an electronic control device using the lead frame 15 will be described. The electronic control device is structured as an electric power steering device.

Figure 5:
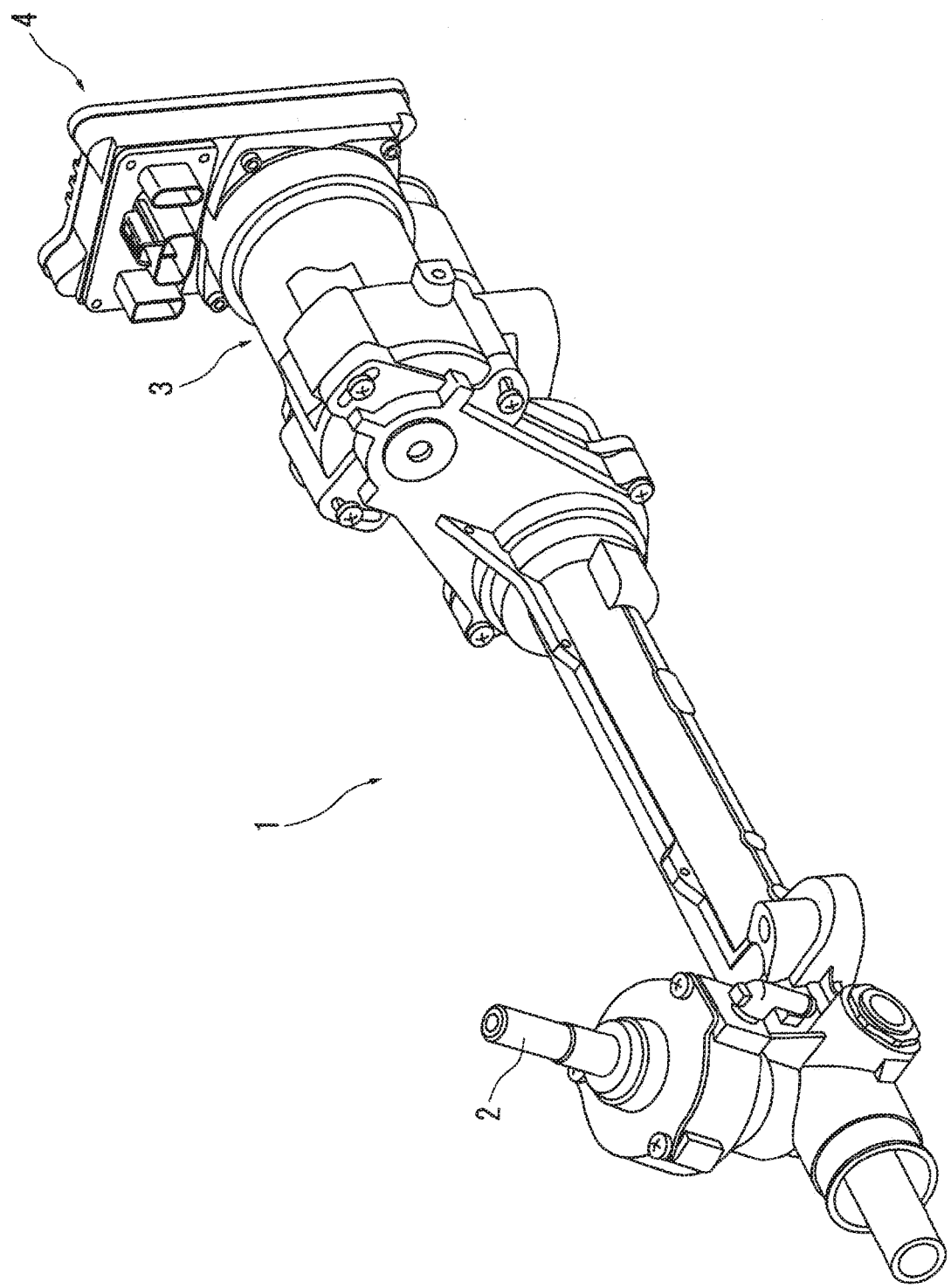
FIG. 5 is a view showing the structure of a power steering device.

As shown in FIG. 5, electric power steering device 1 is equipped with input shaft 2, to which a steering torque is inputted from a steering wheel, and motor unit 3 which adds assisting torque to the steering torque. Motor unit 3 is driven and controlled by electronic control unit (ECU) 4. Lead frame 15 of the present invention is installed and used in this electronic control unit 4.

Figure 6:
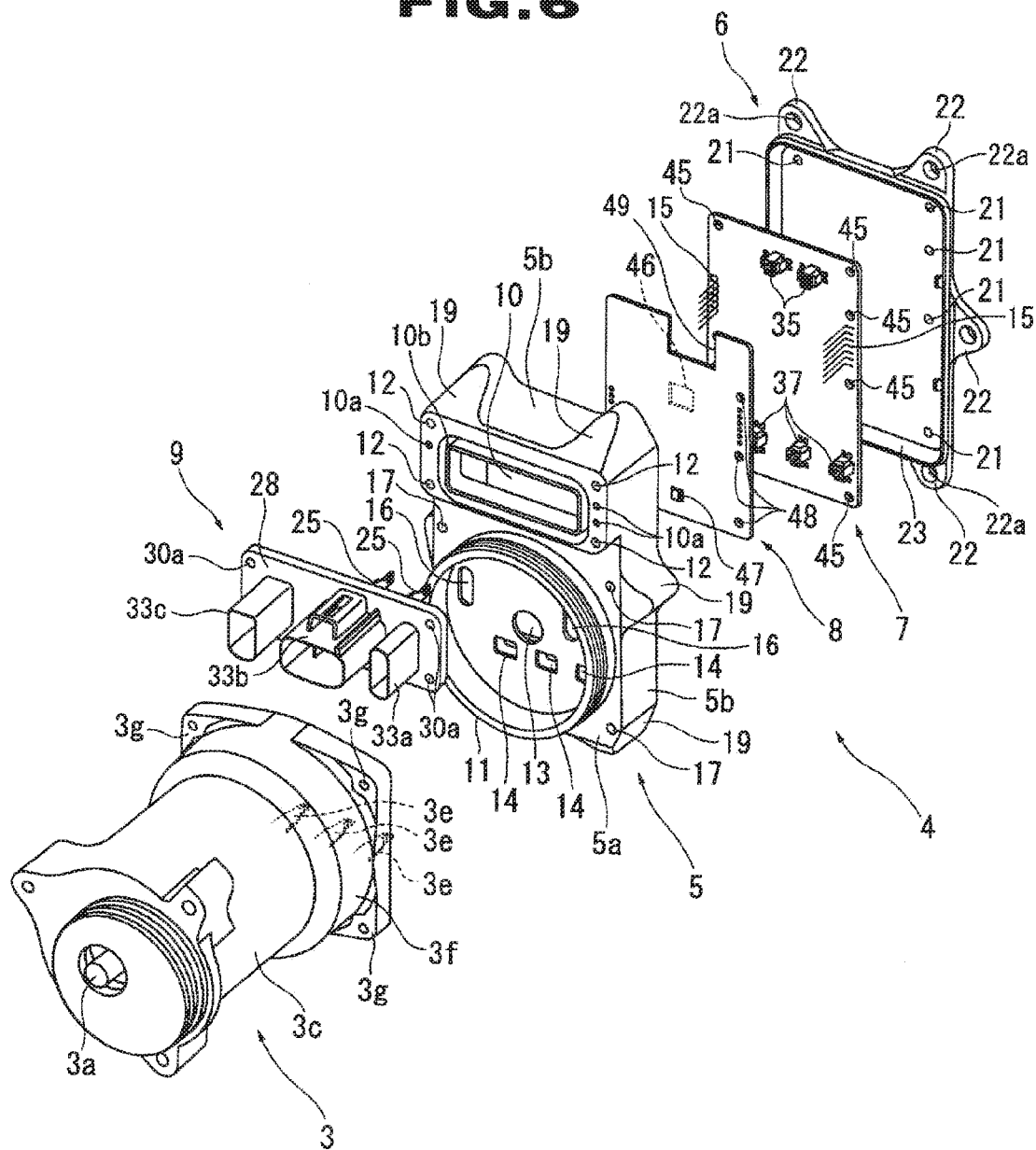
FIG. 6 is an exploded perspective view of an electronic control unit.

As shown in FIG. 6, the electronic control unit 4 is arranged on the base end side (the side opposite to an end portion of the output side, i.e., an end portion of the side corresponding to the undermentioned control circuit board 8) of shaft 3a of motor unit 3.

This motor unit 3 is equipped with an electric motor (three phase alternating current type brushless motor) not shown in the drawings, motor housing 3c accommodating the electric motor, the shaft 3a rotatably driven by the electric motor, sensor magnet S (refer to FIG. 7) which is attached to the base end of shaft 3a and detects rotation of shaft 3a by the undermentioned Hall element 47, and first electric terminals (three phase motor terminals) 3e respectively connected to terminals of the three phases of the motor. This shaft 3a is rotatably driven by the electric motor and adds assisting torque to steering torque via a reduction gear not shown in the drawings. Furthermore, exterior section 3f with a large outside dimension is formed on the side of electronic control unit 4 of motor housing 3c, and boss sections 3g are formed on four corners of exterior section 3f.

Specifically, electronic control unit 4 has case (housing body section) 5 secured to exterior section 3f of motor housing 3c, cover (lid portion) 6 connected to case 5, drive circuit board 7 which is accommodated between case 5 and cover 6 and drives the electric motor, control circuit board 8 which is accommodated between case 5 and cover 6 similar to drive circuit board 7 and controls driving of drive circuit board 7, and electric connector 9 which provides electricity, etc. to the drive circuit board 7, control circuit board 8 and the electric motor from a power supply battery not shown in the drawings.

Case 5 is made of, for example, aluminum alloy material and formed into a box-like shape with an open top. It has bottom plate 5a, and side plates 5b mounted upright on an edge of bottom plate 5a. As shown in FIG. 6, an upper part of bottom plate 5a protrudes forwardly.

In the upper part of this bottom plate 5a, opening 10 for attaching electric connector 9 is formed with apertures 10a formed around the periphery of opening 10, and internally threaded holes 12 for securing electric connector are formed at four corners of the upper part on the side of motor housing 3c.

Furthermore, on a lower part of bottom plate 5a on the side of motor housing 3c, an annular joint section 11 is formed which fits into an opening (not shown in the drawings) of exterior section 3f, and internally threaded holes 17 for securing to exterior section 3f are formed at four corners. Shaft portions of fixing screws, not shown in the drawings, which are inserted into through holes of exterior section 3f, are fastened to these internally threaded holes 17.

Formed in the center of joint section 11 is a circular opening 13 for receiving sensor magnet S attached to the base end of shaft 3a (shaft base end). Formed under the opening 13 are three horizontally-long rectangular shaped openings 14 into which first electric terminals 3e (three-phase motor terminals) on the side of the three-phase motor are inserted. Formed on the diagonally upper right and left sides of opening 13 is a pair of vertically-long rectangular shaped openings 16 toward which the ends of lead frames (electric terminals) 15 connecting drive circuit board 7 and control circuit board 8 are directed.

Figure 7:
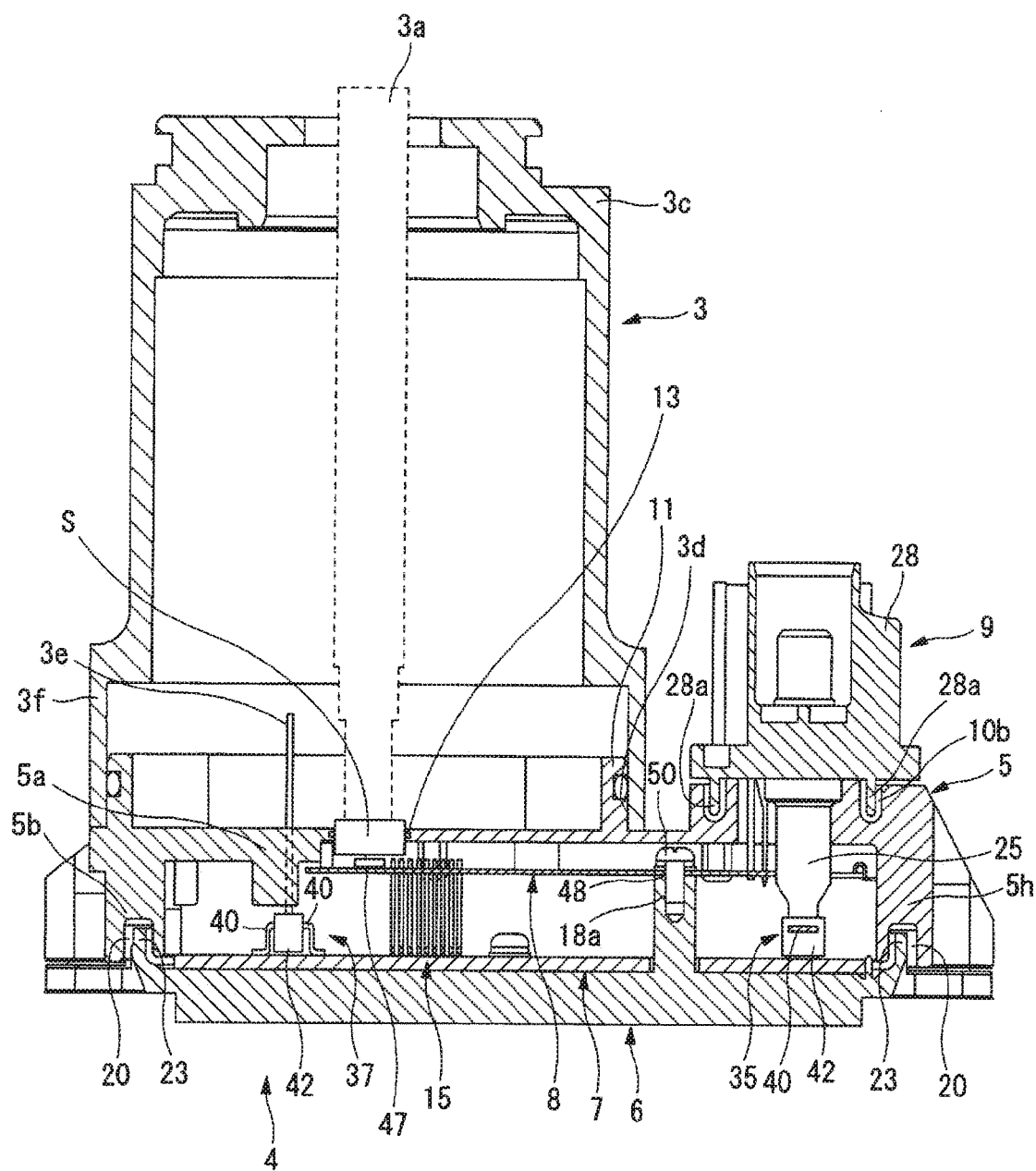
FIG. 7 is a longitudinal sectional view of a substantial part of the electronic control unit attached to a motor unit.

Moreover, a plurality of cylindrical board securing sections 18 (see FIG. 8), which secure control circuit board 8, are formed in a standing manner on bottom plate 5a on the side of cover 6. Furthermore, boss section 19 is formed at a predetermined position on an exterior surface of each side plate 5b. Also, as shown in FIG. 7, fitting groove 20 is formed on an end surface of each side plate 5b, and fitting protrusion 23 formed on cover 6 fits into fitting groove 20.

As shown in FIG. 6, cover 6 is rectangularly shaped by using aluminum alloy material, etc. to follow the contour of case 5 and closes the opening of case 5.

Furthermore, a group of internally threaded holes 21 for fixing drive circuit board 7 are formed on right and left edges of cover 6. Boss section(s) 22 is formed on each end face in a position(s) corresponding to boss section(s) 19. Through hole 22a is formed in boss section 22. A shaft portion of the fixing screw (not shown in the drawings) inserted into this through hole 22a is fastened to internally threaded hole 17 of boss section 19. Further, a heat sink, not shown in the drawings, is formed on the side of cover 6 opposite to case 5.

Electric connector 9 is attached to the peripheral edge of opening 10 of case 5. As shown in FIG. 11 (b), it has a pair of first connectors C1 each of which has a resin molded portion 30 at a generally central part of first electric terminal (power supply terminal) 25 on the connector side, second connector C2 which has a resin molded portion 30 at a generally central part of various signal terminals (torque/S, ignition SW, etc.), third connector C3 which has a resin molded portion 30 at a generally central part of CAN communication terminals 27, and fourth connector 28 (see FIG. 6) on which first connector C1 to third connector C3 are fixed. Opening 10 is closed by fourth connector 28.

This fourth connector 28 comprises a connector holder which holds first connector C1 to third connector C3 with three attachment holes (not shown in the drawings) formed therethrough in which first connector C1 to third connector C3 are inserted. In addition, the periphery of resin molded portions 30 of first connector C1 to third connector C3 connects to the inner surface of each of these attachment holes. With this, first connector C1 to third connector C3 are held and fixed on fourth connector 28. Specifically, upon connecting first connector C1 to third connector C3 with fourth connector 28, first connector C1 to third connector C3, which have resin molded portions 30 at generally central parts of the terminals 25 to 27, are inserted into respective attachment holes in fourth connector 28 and connected thereto. After this connection, an adhesive (sealant) is applied to the gap between first connector C1 to third connector C3 and fourth connector 28 in order to make the gap watertight and to strengthen the connecting force between first connector C1 to third connector C3 and fourth connector 28. Electric connector 9 is completed by connection of first connector C1 to third connector C3 with fourth connector 28 and is attached to the peripheral edge of opening 10.

As shown in FIG. 7, on fourth connector 28 on the side of case 5, attaching section 28a is formed which is fitted into circumferential groove 10b formed on the peripheral edge of opening 10. On the side opposite to case 5, connector fitting sections 33a to 33c are formed, as shown in FIG. 6.

Through holes 30a are formed at four corners of fourth connector 28. Further, as shown in FIG. 10(b), pins 31 to be inserted into apertures 10a of case 5 are formed between the corresponding through holes 30a on the side surface of fourth connector 28 on the side of case 5.

Since the number of pins 31 and apertures 10a are left-right asymmetric, an accidental reversed left-right attachment of electric connector 9 is prevented.

As shown in FIG. 11(b), ends of the terminals 25 to 27 are arranged on the side of drive circuit board 7, and the other ends of terminals 25 to 27 are arranged in connector fitting sections 33a to 33c. In addition, the ends of the terminals 26, 27 are formed in a pin shape. On the other hand, one end of the first electric terminals 25 is formed into a tapered strip. As shown in FIG. 10(b), the end of first electric terminals 25 is cut out into a V-shape to form a pair of clamping sections 25a, 25a. The inner sides of the ends of this pair of clamping sections 25a, 25a are formed into tapered surfaces 25b (ends of first electric terminals 3e on the three-phase side are formed into a similar shape).

A connector fitting section formed on an electric connector of an external device (for example, a power supply battery, etc.), not shown in the drawings, is fit into each of connector fitting sections 33a to 33c, and the other end of each of terminal 25 to 27 is electrically connected to an electric terminal of each external device.

Drive circuit board 7 constructs a power module which converts a current provided from electric connector 9 into a three-phase (U-phase, V-phase and W-phase) alternating current and drives the electric motor in response to control signals from control circuit board 8.

Further, as shown in FIG. 9(a), there are mounted second electric terminals 35 for power supply which are electrically connected with ends of first electric terminals 25, drive transistors (drive elements, switching elements) 36 in which upstream side P and downstream side Q of each phase of the three-phase alternating currents are electrically connected in series, and second electric terminals 37 for a three-phase motor electrically connected to ends of the first electric terminals 3e.

In other words, drive transistors 36 are mounted on drive circuit board 7 with a "two (2) (a set of upstream side P and downstream side Q as a pair) by three (3) set (for three-phases)" arrangement. The second electric terminal 37 is positioned between each upstream side drive transistor 36 and each downstream side drive transistor 36 of each set and provides a three-phase alternating current to each of the first electric terminals 3e.

The second electric terminals 35 are each positioned opposite to one end of the first electric terminals 25, and each the second electric terminals 37 is positioned opposite to one end of the first electric terminals 3e. Each of the second electric terminals 35, 37 is formed by bending a metal plate such as a copper material, and includes two cranked split sections 40, 40 and shaft 41 between these split sections 40, 40, as shown in FIG. 9(b).

The bottom surface of base end section 40a of each split section 40, bent in an L-shape, is electrically joined to the drive circuit board 7 by soldering or welding, and ends of both split sections 40 on the side of shaft 41 and both ends of shaft 41 are embedded in terminal holder 42 having a concave cross section. There is formed a lengthwise-long opening 43 in the upper part of terminal holder 42 in which one end of the first electric terminals 3e, 25 is inserted.

Inclined surfaces 44 are formed on the opening edges of this opening 43 to guide one end of first electric terminals 3e, 25 upon insertion, and a supporting section (which may be formed as a through hole) 43a which supports shaft 41 is formed in opening 43. Also, in opening 43, as shown in FIGS. 10 (a) and (b), both clamping sections 25a of first electric terminals 3e, 25 sandwich and connect with shaft 41 whereby the electric terminals 25, 35, 3e and 37 are electrically connected.

Moreover, as shown in FIG. 9(a), electronic components such as smoothing capacitors 38, fail safe relay 39 which operates when failure occurs, and coils 60 are mounted on drive circuit board 7. Smoothing capacitor 38 smooths out the current provided by an electric connection of both electric terminals 25, 35 and provides it to each drive transistor 36.

On the right and left edges of drive circuit board 7, there are formed a group of through holes 45 for fixing to cover 6. A shaft portion of a fixing screw (not shown in the drawings) inserted through each through hole 45 is fastened to an internally threaded hole 21 of cover 6, as shown in FIG. 6.

Furthermore, on the right and left edges of drive circuit board 7, there are attached the lead frames 15 of the present invention which connect drive circuit board 7 and control circuit board 8. Land-connection sections 15c of lead frame 15 are connected to lands 7d of drive circuit board 7, as shown in FIGS. 1 to 3, and then lead frame 15 is cut off at thin sections 15g, as shown in FIG. 4. With this, joining section 15e is separated and removed from leads 15d and only leads 15d remain on drive circuit board 7.

Control circuit board 8 is comprised of a print-circuit board (glass epoxy board) or ceramic board. As shown in FIG. 6, this control circuit board 8 includes CPU (hereunder abbreviated as microprocessor) 46 which controls each drive transistor 36, and Hall element 47 which detects the rotation of the electric motor.

The microprocessor 46 is mounted on a surface of control circuit board 8 opposed to drive circuit board 7, whereas Hall element 47 is mounted on a surface opposite to the microprocessor 46, that is, the surface opposed to sensor magnet S received and positioned in opening 13 of case 5. Microprocessor 46 and Hall element 47 are electrically connected by a circuit pattern on control circuit board 8, and the circuit pattern becomes a signal transmission path between microprocessor 46 and Hall element 47.

In other words, Hall element 47 is located in a position opposed to sensor magnet S on the side of one end of control circuit board 8 and detects the magnetic field of sensor magnet S using Hall effect, thereby detecting rotation of shaft 3a. This detection signal is input to microprocessor 46 via circuit pattern of control circuit board 8.

Further, as shown in FIG. 11(*b*), the ends of terminals 15a of lead frame 15 pass through the side of one end of control circuit board 8, and those ends are electrically connected to control circuit board 8 by soldering or welding, etc. On the other hand, on the side of the other end of control circuit board 8, cut out 49 is formed which allows ends of the electric terminals 25 to pass through to the side of drive circuit board 7. On both sides of this cutout 49, ends of the terminals 26, 27 are inserted and electrically connected.

Therefore, microprocessor 46 controls drive transistors 36 based on information (for example, steering torque, vehicle speed signals, etc.) input from the outside via terminals 26, 27 of electric connector 9 and detection signals of Hall element 47.

Figure 8:
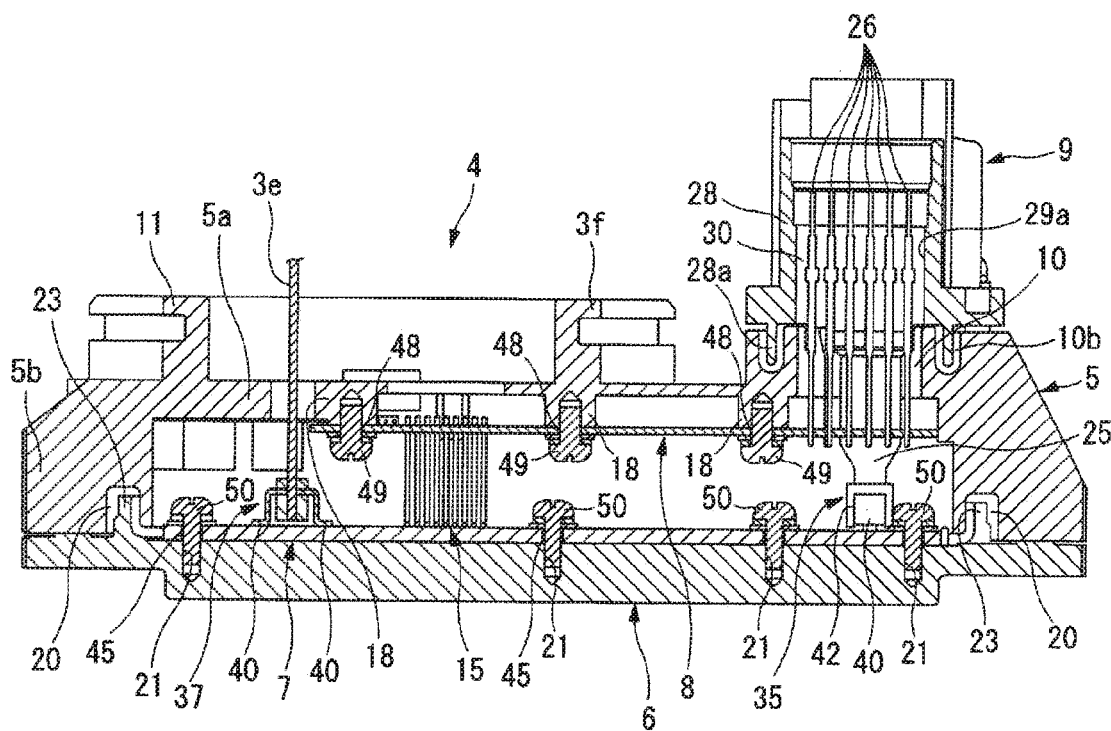
FIG. 8 is a longitudinal sectional view of the electronic control unit.
Figure 9:
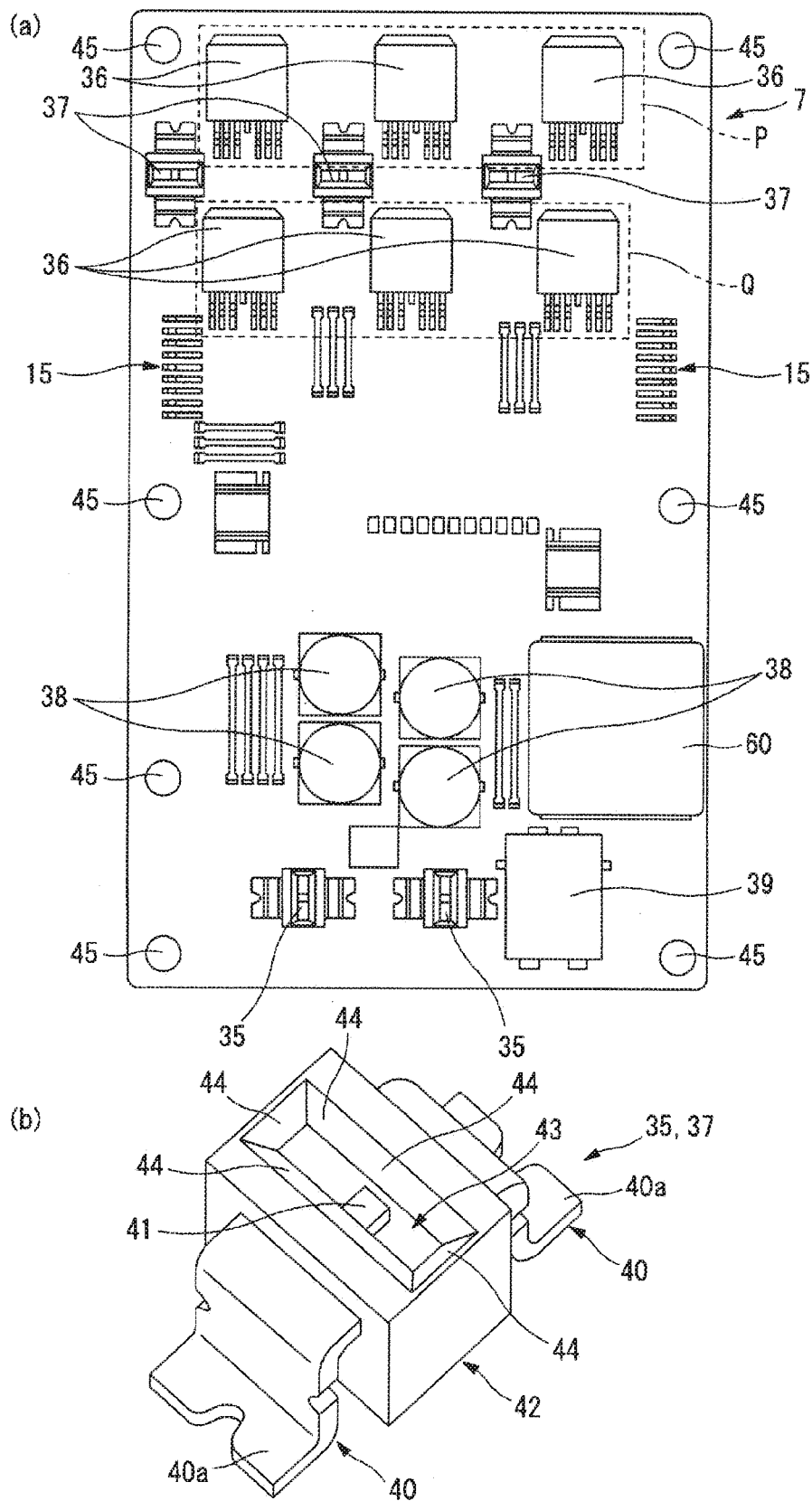
FIG. 9 (*a*) is a plan view of a drive circuit board, and FIG. 9 (*b*) is an enlarged perspective view of a second electric terminal.

In addition, a group of through holes 48 are formed on right and left edges of control circuit board 8, and the shaft portion of fixing screw 50 inserted through each through hole 48 is fastened to an internally threaded hole 18a of board securing section 18, as shown in FIG. 8.

Electronic control unit 4 of this embodiment uses lead frame 15 shown in FIGS. 1 to 4 as lead frame 15. By connecting land-connection sections 15c of lead frame 15 to lands 7d of a circuit board such as drive circuit board 7, and then separating and removing joining section 15e from leads 15d, it prevents the joining section from occupying extra space in an electronic control device and allows downsizing and weight reduction of the electronic control device. Although an electric power steering device was explained as an example of an electronic control device in the above embodiment, the electronic control device is not limited to an electric power steering device, but may be broadly applied to electronic control devices using a circuit board and a lead frame.

Next, a method of mounting a lead frame, more specifically, a method of mounting a lead frame on a circuit board will be explained.

The method of mounting a lead frame of the present invention comprises a lead frame placing step in which the lead frame is placed on a circuit board, a lead frame fixing step in which the lead frame is fixed to the circuit board, and a lead frame cutting step in which an unnecessary portion is cut and removed from the lead frame fixed on the circuit board.

In the lead frame placing step, as shown in FIGS. 2 and 3, lead frame 15 is placed on drive circuit board 7. The placement of lead frame 15 is performed by a lead frame automatic mounting device (not shown in the drawings) which picks up suction surface 15f of the surface of joining section (base) 15e via suction. Further, as shown in FIG. 3, land-connection sections 15c are positioned over lands 7d, and a portion of land-connection sections 15c (a portion including thin sections 15g if thin sections are formed on land-connection sections 15c) is placed above insulating layer 7b outside lands 7d.

In lead frame fixing step, the overlapping portions of land-connection sections 15c, excluding the portion protruding outward from lands 7d, and lands 7d are connected and fixed by soldering, etc.

In lead frame cutting step, the portion protruding outward from lands 7d is cut off. By cutting the portion protruding outward from lands 7d, the unnecessary joining section 15e is separated from leads 15d. Thereby, only leads 15d will remain on the side of drive circuit board 7.

According to the lead frame mounting method, in the lead frame placing step, the land-connection sections are positioned over the lands, and the lead frame is placed on the circuit board with a portion of the land-connection sections protruding above an insulating layer outside the lands. In the lead frame securing step, the land-connection sections are connected and fixed to the lands except for the portion protruding above the insulating layer. In the cutting step, the portion protruding above the insulating layer which is not connected nor fixed by soldering, etc. is cut.

Thus, the followings are provided.

(1) Cutting will be facilitated as compared with cutting a portion connected and fixed to the circuit board by soldering, etc.; and (2) Stress which might act on the soldered connection, land-connection sections or lands upon cutting may be avoided, and the joining section can easily be removed from the circuit board without applying a heavy load on these sections.

It is possible to achieve at least one of the above effects (1) and (2).

Next, assembling procedures of the above electronic control unit 4 will be explained. In the first place, control circuit board 8 and electric connector 9 are attached to case 5, and drive circuit board 7 is attached to cover 6.

Upon attaching control circuit board 8, as shown in FIG. 8, while maintaining a condition in which Hall element 47 is opposed to opening 13 of cover 6, the shaft portion of fixing screw 50 is inserted through each through hole 48 of control circuit board 8, and then the shaft portion of each screw 50 is fastened to internally threaded hole 18a of each board fixing section 18 of case 5.

Upon attaching electric connector 9, first connector C1 to third connector C3, each having resin molded portion 30 at a generally central part of each of terminals 25 to 27, are inserted into fourth connector C4 to complete the connection. After that, electric connector 9 is attached to the periphery edge of opening 10 of case 5. That is, as shown in FIG. 8, attaching section 28a of fourth connector 28 is fit into circumferential groove 10b of case 5, and pins 31 are fit into holes 10a, as shown in FIG. 10(*b*). Subsequently, as shown in FIG. 6, shaft portions of screws are inserted into through holes 30a and fastened to internally threaded holes 12. Then, ends of terminals 26 and 27 are electrically joined to control circuit board 8 by soldering, etc. Upon attaching drive circuit board 7, as shown in FIG. 8, shaft portions of screws 50 are inserted through through holes 45 of drive circuit board 7 and fastened to internally threaded holes 21 of cover 6.

Next, case 5 with electric connector 9 and control circuit board 8 attached thereto and cover 6 with drive circuit board 7 attached thereto are assembled together. Upon performing this operation, ends of first electric terminals 25 on the side of the connector are opposed to second electric terminals 35 for a power source mounted on drive circuit board 7 through cut out 49 of control circuit board 8. While maintaining this condition, fitting protrusion 23 is fit into fitting groove 20 of case 5.

At this time, one end of first electric terminal 25 is inserted into opening 43 of second electric terminal 35 by a fitting force which fits fitting protrusion 23 into fitting groove 20. That is, upon assembly of case 5 and cover 6, both clamping sections 25a of first electric terminal 25 move toward opening 43 while they are guided by inclined surfaces 44 of second electric terminal 35. Then, they enter opening 43 along tapered surfaces 25b and clamp shaft 41 therebetween.

Therefore, both clamping sections 25a and shaft 41 are connected at the same time when fitting protrusion 23 of cover 6 is fit into fitting groove 20 of case 5. With this, electric terminals 25, 35 are directly electrically connected. Thereby, it is possible to electrically connect electric terminals 25, 35 without a third member (for example, a direct current bus bar, etc. of Patent Publication 1) for wire bonding or welding. In this respect, the number of components of the electronic control unit will be reduced, and this may contribute to lowering costs of the device. Moreover, the reduced number of components may contribute to downsizing of the device or simplification of the number of manufacturing steps, and the work load may be reduced.

When conducting this operation, as shown in FIG. 11(a), the end of each terminal 15a of lead frame 15 is inserted through control circuit board 8 and received and positioned in opening 16 of case 5. Therefore, each terminal 15a may be electrically joined to control circuit board 8 by soldering or welding after assembling case 5 and cover 6. In this regard, it will be possible to place control circuit board 8 and drive circuit board 7 in a stacked position. After this electrical joining, shaft portions of fixing screws are inserted through through holes in boss sections 22 of cover 6. Then, the shaft portions are fastened to internally threaded holes in boss sections 19 of case 5. With this, Case 5 and cover 6 are joined to complete assembly.

Further, after such assembly, electronic control unit 4 is attached to motor unit 3. During this operation, joint section 11 of case 5 is opposed to opening 3d of exterior section 3f, and then joint section 11 is fit into opening 3d. At this time, the end of each first electric terminal 3e is opposed to each opening 14. Therefore, it is press-fitted into opening 43 of second electric terminal 37 simultaneously with the fitting of joint section 11, similar to first electric terminal 3e. Thus, clamping sections 25a and shaft 41 are connected, and electric terminals 3e, 37 are directly electrically connected thereby. Also with regard to this point, the third member may be omitted, and it will contribute to reducing the parts count.

Subsequently, electronic control unit 4 is attached to motor housing 3c by inserting shaft portions of fixing screws through through holes in boss sections 3g and fastening the shaft portions to internally threaded holes 17 in case 5. In this case, the electric motor and power module are fixed to different enclosures (case 5 or cover 6). Therefore, heat interference occurring in each device may be suppressed, and it may contribute to the improvement of heat dissipation.

Moreover, in terms of positioning components on drive circuit board 7, second electric terminal 37 is positioned between upstream side P drive transistor 36 and downstream side Q drive transistor 36. Therefore, positional interference between the electric motor shaft 3a and second electric terminals 37 may be prevented. Furthermore, since the wiring distance between both drive transistors 36 and second electric terminal 37 may be reduced, the complexity of wiring may be prevented. In terms of the order of assembling electronic control unit 4, it is optional that motor unit 3 and case 5 are assembled first, and then case 5 and cover 6 are assembled.

Next, the second embodiment of the present invention will be explained with reference to FIGS. 12 to 15.

In the second embodiment, there is provided a pressure mechanism 101 for pressing land-connection sections 15c, which are provided on the lower ends of pin-shaped terminals 15a of lead frame 15, against lands 7d.

Figure 12:
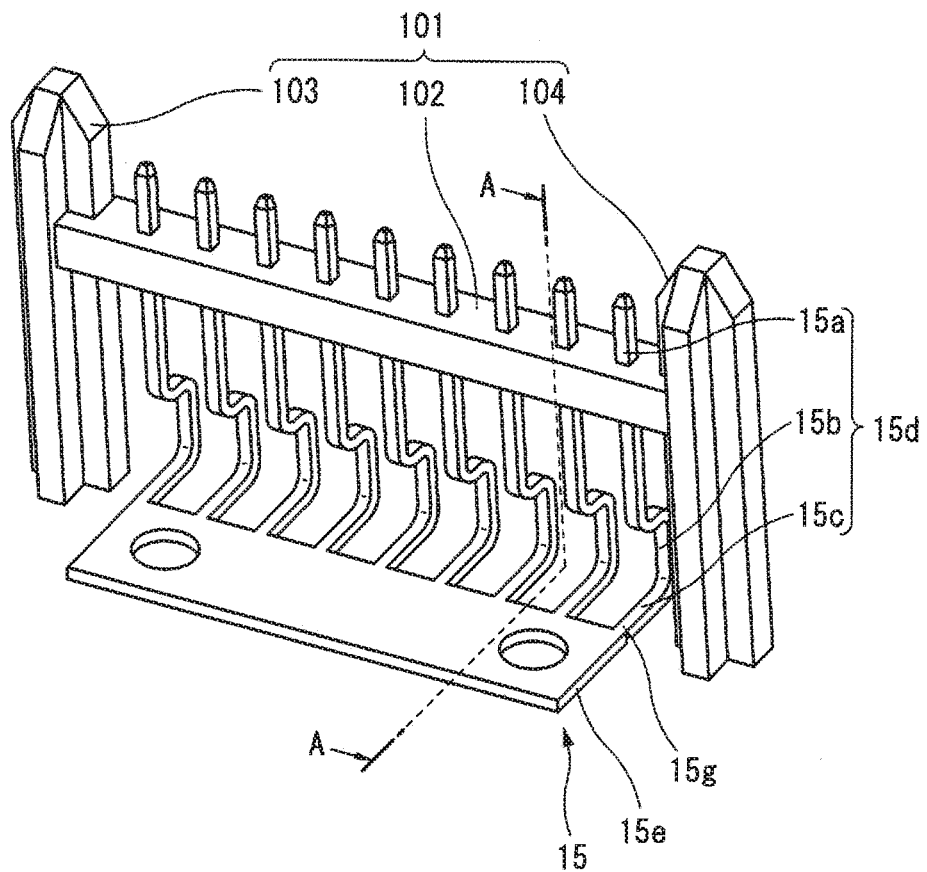
FIG. 12 is a perspective view of a second embodiment of the lead frame.

As shown in FIG. 12, pressure mechanism 101 comprises beam 102 connecting a plurality of pin-shaped terminals 15a at an upper end side thereof and a pair of columns 103 and 104 positioned on both ends of beam 102.

Figure 13:
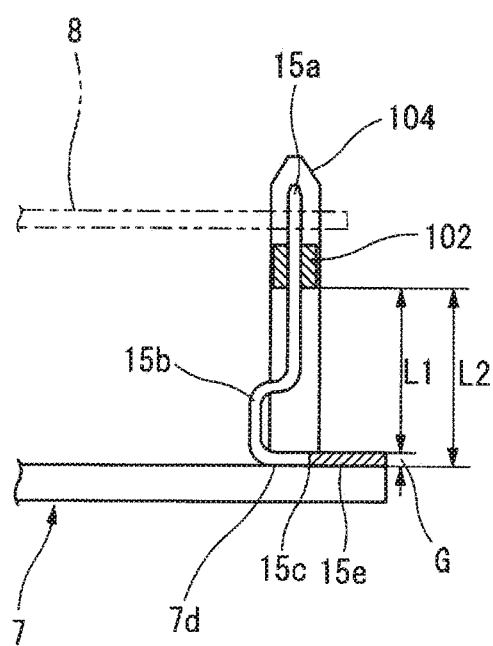
FIG. 13 is a sectional view taken along A-A of FIG. 12.

As shown in FIG. 13 (cross sectional view along A-A of FIG. 12), length L1 of columns 103 and 104 below beam 102 is set shorter than length L2 of terminals 15a below beam 102 (L1<L2) so that a predetermined gap G will be formed between the bottom ends of columns 103 and 104 and the top surface of drive circuit board 7.

Therefore, when the top ends of columns 103 and 104 are pressed by a pressing member (not shown in the drawings), land-connection section 15c of each terminal 15a will be pressed on land 7d of drive circuit board 7 via beam 102. With this, a loose connection between land-connection section 15c and land 7d will be prevented. Furthermore, stress load upon pressing may be absorbed by elastic deformation of bent sections 15b formed on the lower ends of terminals 15a. With this, pressure acting on the soldered connection may be suppressed, and the occurrence of cracks or deterioration thereof may be prevented.

Figure 14:
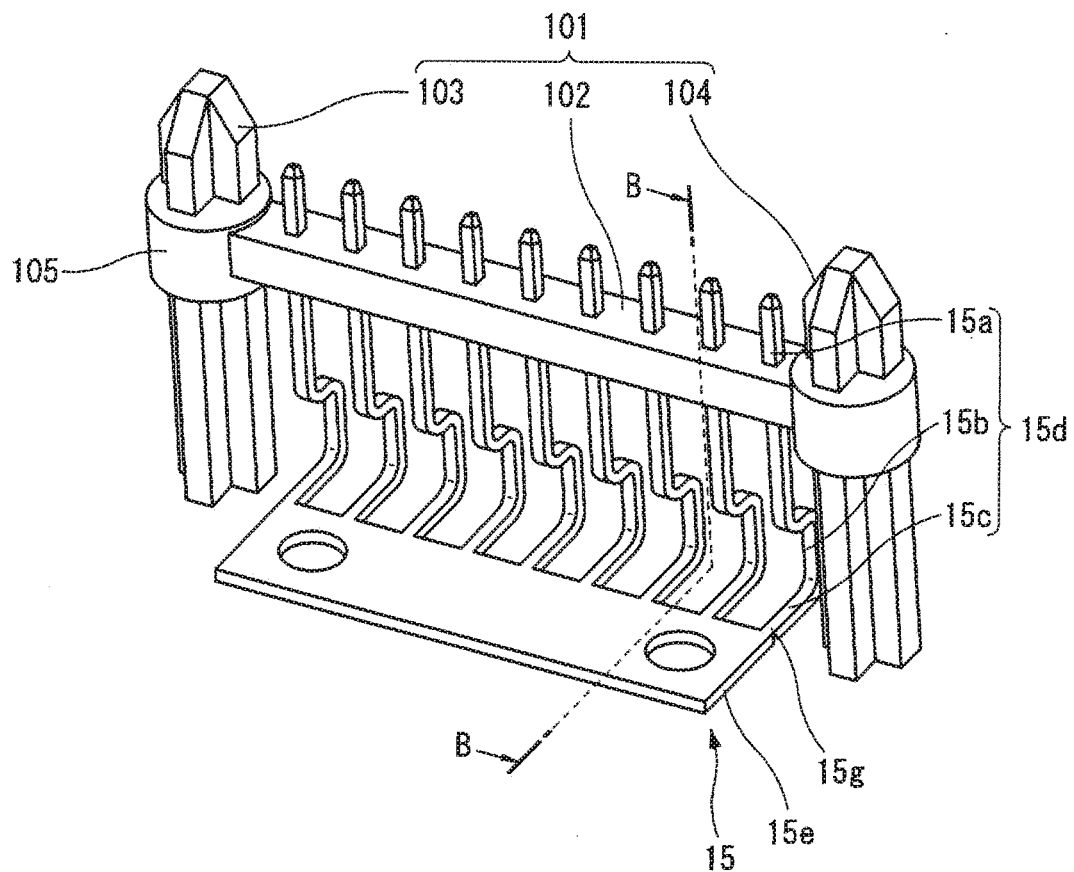
FIG. 14 is a perspective view showing a variation of the second embodiment of the lead frame.
Figure 15:
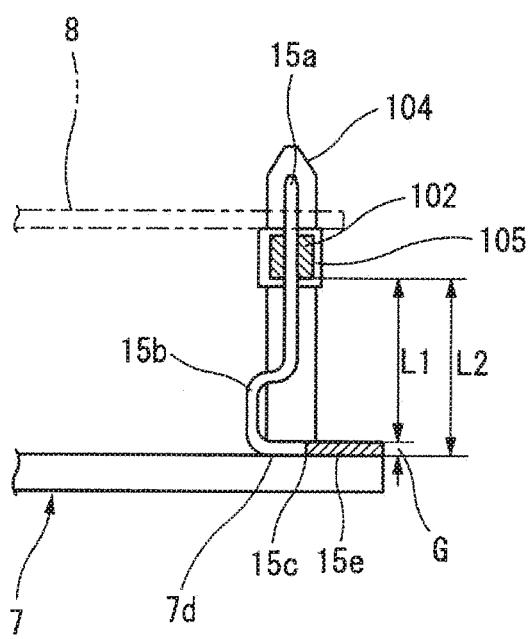
FIG. 15 is a sectional view taken along B-B of FIG. 14.

FIGS. 14 and 15 show a modified example of pressing mechanism 101 shown in FIGS. 12 and 13. In this example, bases 105 are formed on the upper ends of columns 103 and 104 and pressed by another circuit board such as control circuit board 8.

Therefore, a pressing member for pressing the upper ends of columns 103 and 104 will not be necessary, and it will be possible to ensure attachment of a circuit board such as control circuit board 8 to circuit board 7. Other structures are nearly the same as those shown in FIGS. 12 and 13. Therefore, the same symbols are applied to the same components, and redundant explanation is omitted.

EXPLANATION OF SYMBOLS

1: electronic control device (electric power steering device)
4: electronic control unit (ECU)
7: drive circuit board (circuit board)
7a: metal plate
7b: insulating layer
7c: wiring pattern
7d: land
8: control circuit board
15: lead frame
15a: pin-shaped terminal
15b: bent section
15c: land-connection section
15d: lead
15e: joining section
15f: suction surface
15g: thin section

The invention claimed is:
1. A lead frame for achieving an electrical connection between first and second circuit boards, comprising:
  a plurality of leads having a land-connection section formed on one end of each of a plurality of pin-shaped terminals with a bent section therebetween, another end of each of the plurality of the pin-shaped terminals being connected with the first circuit board, and
  a plate-like joining section that joins a lower end of each of the plurality of leads,
  wherein, in the plurality of leads, the land-connection section has one end connected to the joining section and another end from which a respective terminal of the plurality of terminals is formed so as to stand upright via the bent section, wherein the joining section maintains each terminal of the plurality of terminals in an upright standing condition via the bent section, wherein the joining section has a first portion that is adapted to be positioned and mounted on a top surface of a side edge of the second circuit board when the land-connection section of the lead frame is disposed on a land formed on the second circuit board, and wherein the joining section has a second portion that is adapted to outwardly protrude from the side edge of the second circuit board when the land-connection section of the lead frame is disposed on the land formed on the second circuit board.

2. An electronic control device, comprising:

a lead frame for achieving an electrical connection between first and second circuit boards, the lead frame including:
- a plurality of leads having a land-connection section formed on one end of a plurality of pin-shaped terminals with a bent section therebetween, another end of each of the plurality of the pin-shaped terminals being connected with the first circuit board, and
- a plate-like joining section that joins a lower end of each of the plurality of leads, wherein, in the plurality of leads, the land-connection section has one end connected to the joining section and another end from which a respective terminal of the plurality of terminals is formed so as to stand upright via the bent section, wherein the joining section maintains each terminal of the plurality of terminals in an upright standing condition via the bent section, wherein the joining section has a first portion that is adapted to be positioned and mounted on a top surface of a side edge of the second circuit board when the land-connection section of the lead frame is disposed on a land formed on the second circuit board, wherein the joining section has a second portion that is adapted to outwardly protrude from the side edge of the second circuit board when the land-connection section of the lead frame is disposed on the land formed on the second circuit board, and wherein the lower end of each of the plurality of leads has a cross section that is adapted to be formed by cutting the joining section from the lead frame, the cross section facing an outside of the second circuit board.

* * * * *